US008335087B2

(12) United States Patent
Xie et al.

(10) Patent No.: US 8,335,087 B2
(45) Date of Patent: Dec. 18, 2012

(54) METHOD AND APPARATUS FOR IMPROVING RADIO PERFORMANCE OF WIRELESS DATA TERMINAL DEVICE

(75) Inventors: Yanping Xie, Guangdong (CN); Shuhui Sun, Guangdong (CN); Qizhi Zhan, Guangdong (CN); Shuqiang Gong, Guangdong (CN); Chaoyan Zhang, Guangdong (CN)

(73) Assignee: Huawei Device Co., Ltd., Shenzhen (CN)

( * ) Notice: Subject to any disclaimer, the term of this patent is extended or adjusted under 35 U.S.C. 154(b) by 290 days.

(21) Appl. No.: 12/645,192

(22) Filed: Dec. 22, 2009

(65) Prior Publication Data

US 2010/0161865 A1 Jun. 24, 2010

(30) Foreign Application Priority Data

Dec. 22, 2008 (CN) ...................... 2008 2 0183210 U
Sep. 28, 2009 (WO) ................ PCT/CN2009/074272

(51) Int. Cl.
*H05K 7/00* (2006.01)

(52) U.S. Cl. ........................................ 361/799; 361/808

(58) Field of Classification Search .................. 361/794, 361/799, 767, 777, 803, 808, 790; 439/607, 439/79, 83, 566, 569, 876
See application file for complete search history.

(56) References Cited

U.S. PATENT DOCUMENTS 5,961,350 A 10/1999 Shiu
6,059,583 A * 5/2000 Croft et al. .................... 439/131
6,567,273 B1 * 5/2003 Liu et al. ........................ 361/737
6,597,343 B1 * 7/2003 Akiyama et al. .............. 345/168
6,736,677 B1 * 5/2004 Lin et al. .................. 439/607.28
6,799,997 B2 * 10/2004 Lin et al. .................. 439/607.51
7,097,472 B2 * 8/2006 Parker ........................... 439/131
7,140,910 B1 * 11/2006 Liao .............................. 439/502
7,172,428 B2 * 2/2007 Huang ............................ 439/11
7,179,099 B2 * 2/2007 Hsieh ............................ 439/131
7,217,159 B2 * 5/2007 Chung ..................... 439/607.01
(Continued)

FOREIGN PATENT DOCUMENTS

CN 2678164 Y 2/2005
(Continued)

OTHER PUBLICATIONS

Written Opinion of the International Searching Authority in corresponding PCT Application No. PCT/CN2009/074272 (Jan. 7, 2010).

(Continued)

*Primary Examiner* — Hung S Bui
(74) *Attorney, Agent, or Firm* — Leydig, Voit & Mayer, Ltd.

(57) ABSTRACT

A wireless data terminal device comprises a detachable USB connector and a main circuit board, where at least two redundancy grounding connections are provided between the detachable USB connector and the main circuit board, and the grounding points of the at least two redundancy grounding connections are not adjacent to each other. A method for improving the radio performance of the wireless data terminal device is further provided. With the wireless data terminal device or the method for improving the radio performance of the wireless data terminal device, the connection of the grounding plane of the wireless data terminal device with the grounding plane of a computer is effectively enhanced. Therefore, the radio performance of the wireless data terminal device is improved.

15 Claims, 3 Drawing Sheets

U.S. PATENT DOCUMENTS

| | | | | |
|---|---|---|---|---|
| 7,906,956 | B2 * | 3/2011 | Matias | 324/133 |
| 2003/0045176 | A1 * | 3/2003 | Liu | 439/687 |
| 2004/0229478 | A1 | 11/2004 | Chen | |
| 2006/0154526 | A1 | 7/2006 | Uetsuki | |
| 2006/0273817 | A1 | 12/2006 | Hsieh et al. | |
| 2010/0066677 | A1 * | 3/2010 | Garrett et al. | 345/163 |

FOREIGN PATENT DOCUMENTS

| | | | |
|---|---|---|---|
| CN | 2746455 | Y | 12/2005 |
| CN | 2773927 | Y | 4/2006 |
| CN | 201323599 | Y | 10/2009 |
| EP | 1633173 | A1 | 3/2006 |
| JP | 2000347790 | A | 12/2000 |
| JP | 2000357421 | A | 12/2000 |
| JP | 3078521 | U | 7/2001 |
| JP | 2001-306495 | A | 11/2001 |
| JP | 2002163044 | A | 6/2002 |
| JP | 2003241867 | A | 8/2003 |
| JP | 2006185246 | A | 7/2006 |
| JP | 2009111552 | A | 5/2009 |
| JP | 2009111553 | A | 5/2009 |
| JP | 2010501097 | A | 1/2010 |
| WO | WO 97/30491 | A1 | 8/1997 |
| WO | WO 2008/021741 | | 2/2008 |

OTHER PUBLICATIONS

Rejection Decision in corresponding Japanese Application No. 2009-291142 (Jul. 19, 2011).

European Patent Office, Extended European Search Report in European Application No. 09180445.0 (Mar. 16, 2010).

State Intellectual Property Office of the People's Republic of China, International Search Report in International Patent Application No. PCT/CN2009/074272 (Jan. 7, 2010).

1st Office Action in corresponding European Application No. 09180445.0 (Jan. 21, 2011).

Office Action in corresponding European Patent Application No. 09180445.0 (Apr. 13, 2012).

* cited by examiner

METHOD AND APPARATUS FOR IMPROVING RADIO PERFORMANCE OF WIRELESS DATA TERMINAL DEVICE

CROSS-REFERENCE TO RELATED APPLICATION

This application claims priorities to Chinese Patent Application No. 200820183210.9, filed on Dec. 22, 2008, and International Patent Application No. PCT/CN2009/074272, filed on Sep. 28, 2009, both of which are hereby incorporated by reference in their entireties.

FIELD OF THE TECHNOLOGY

The present disclosure relates to a wireless data terminal device, and more particularly to a method and an apparatus for improving the radio performance of the wireless data terminal device.

BACKGROUND OF THE DISCLOSURE

A wireless data terminal device is a data device capable of getting access to the Internet by using a wireless network connection, such as 3G network data card and Wireless Fidelity/Worldwide Interoperability for Microwave Access (WIFI/WIMAX) data card. In recent years, with an increasing requirement from people on electronic products, factors of the data card such as size, power consumption and speed are improved continuously to meet the market requirement. For example, a data card is improved to have a movable structure from the prior fixed structure. Such an improvement enables a computer connector or an antenna of the data card to be contracted into the data card when not in use, thereby substantially reducing the size of the data card and eliminating the influences of easily lost accessories such as a USB cap on the data card.

Because the data card is a wireless data terminal device, the radio performance is one of the important factors for measuring the performance of the data card, while the effect of connection of the data card with a computer has important influence on the radio performance of the data card. At the present time, a USB bus is a mainstream mode for establishing connection between the data card and the computer, while the fact that the connector for connecting the data card with a USB connector of the computer is changed to be in a movable type from a fixed type left great influence on the radio performance of the data card.

The inventors of the disclosure find that the existing technology has the following problems in the process of implementing the present disclosure.

In a data card with a fixed USB connector, a USB plug is directly soldered on a main circuit board of the data card. Due to the reliable connection of the USB plug with the main circuit board, it is possible that the grounding plane of a data card circuit is reliably connected with that of the computer, thereby not influencing the radio performance of the data card greatly. However, due to the limitation of size and layout of the USB connector, the data card with the fixed USB connector cannot be reduced unlimitedly, and a USB cap is required to protect the USB connector when the data card is not in use, thereby inevitably influencing the data card due to the loss of the USB cap.

By adopting the mode of separating the main circuit board of the data card from the USB connector, a movable USB connector is realized by connecting the USB connector with the main circuit board via a single thin wire or a Flexible Printed Circuit (FPC) flexible board. However, such a data card with a movable USB connector has some defects: on the one hand, due to the limitation of size of the data card and flex life of a connecting material, it is impossible to use a large connecting wire or FPC flexible board for connecting the USB connector with the main circuit board, so there is only a narrow grounding circuit, thereby the grounding plane of the main circuit board of the data card cannot be connected with that of the computer effectively; on the other hand, the poor connection effect of the grounding plane also influences the radio performance of the data card directly.

FIG. 1 is a schematic illustrating operation of an antenna. It can be known from fundamental principles of the antenna that the antenna serves to convert electric energy into an alternating electromagnetic field and radiate it to space. Under the action of the alternating electromagnetic field, there forms an electric field directing the antenna on the grounding plane surrounding the antenna, as shown in FIG. 1. The grounding plane of the antenna has one important function of enabling as much energy as possible to return to the antenna through the electric field surrounding the antenna to compensate for the energy radiated by the antenna.

When the antenna of the wireless data terminal device is in progress, the grounding plane of the wireless data terminal device serves as a part of the antenna, playing the role of returning energy. Moreover, the grounding plane of the wireless data terminal device is not able to support the energy return of the antenna due to the reduced size of the present wireless data terminal device, for example, the size of such products as a data card has tended to reach a limit. What has been done at present is to utilize the grounding planes of other devices, such as the grounding plane of the computer to support the operation of the antenna of the wireless data terminal device. Therefore, the connection of the wireless data terminal device with the grounding plane of other devices becomes very important.

Before the emergence of a wireless data terminal device with a detachable USB connector, the wireless data terminal device is connected with the computer by means of a fixed USB connector. Such a fixed USB connector is directly connected to the grounding plane of the wireless data terminal device, and is directly connected to the grounding plane of the computer side. The bonding face of the grounding plane of the fixed USB connector is large enough to enable the wireless data terminal device to well realize the return of energy by means of the grounding plane of the computer. However, the greatest problem with the wireless data terminal device with a detachable USB connector is that the USB connector is separated from the main circuit board, and can be connected to the main circuit board only by a flexible connection mode. That is, the USB connector is connected with the grounding plane of the wireless data terminal device only by a thin and narrow conductor such as a flexible wire or FPC flexible board. The requirement on the energy return of the antenna cannot be satisfied unless the flexible connection is sufficiently wide. However, the flexible connection is constrained by factors such as materials, device space, and layout and service life, thereby being difficult to be wider. Therefore, it is difficult for the radio performance of the wireless data terminal device with a detachable USB connector to satisfy the requirement when the wireless data terminal device has only one ground circuit connecting the USB connector and the grounding plane. Moreover, the ground connection further takes on return of the working current of the device, with various serious disturbances, which further deteriorates the work environment of the antenna.

SUMMARY OF THE DISCLOSURE

A main object of the embodiments of the present disclosure is to provide a method and an apparatus for improving the radio performance of a wireless data terminal device to solve the problems of energy return path of an antenna and disturbance, reduce the influence on the radio performance of a data card that is brought by the change in a USB connector of the data card to the movable type, and improve the radio performance of the data card with a detachable USB connector.

The above object of the embodiments of the present disclosure is achieved by the following technical solutions.

A wireless data terminal device includes a detachable USB connector. At least two grounding connections are provided between the detachable USB connector and the wireless data terminal device, and the grounding points of the at least two grounding connections are not adjacent to each other.

A method for improving the radio performance of a wireless data terminal device includes: setting at least two grounding points which are not adjacent to each other on a detachable USB connector of the wireless data terminal device; setting at least two grounding points which are not adjacent to each other on a main circuit board of the wireless data terminal device; and connecting the grounding points on the detachable USB connector with the grounding points on the main circuit board separately.

In accordance with the method and the apparatus for improving the radio performance of the wireless data terminal device according to the embodiments of the present disclosure, the connection between the grounding plane of the wireless data terminal device and the grounding plane of the computer is effectively enhanced by the at least two grounding points which are not adjacent to each other. Therefore, the wireless performance of the wireless data terminal device is improved.

BRIEF DESCRIPTION OF THE DRAWINGS

The accompanying drawings are illustrated to provide a further understanding of the present disclosure and constitute a part of the present application instead of limiting the present disclosure. In the drawings.

DETAILED DESCRIPTION OF THE EMBODIMENTS

To make the objects, technical solutions and advantages of the embodiments of the present disclosure clear, the embodiments of the present disclosure are described in detail by reference to the drawings. The exemplary embodiments of the present disclosure and their explanations herein are used for explaining instead of limiting the present disclosure.

A first embodiment of the present disclosure provides a wireless data terminal device including a detachable USB connector. This embodiment is described in detail by reference to the drawings.

Generally, the wireless data terminal device itself including a detachable USB connector is provided with a grounding wire. However, there is only one thin grounding wire on the wireless data terminal device with the detachable USB connector or connection points are adjacent to each other although there is more than one grounding wire, thereby being equivalent to one grounding circuit practically. Therefore, the connection of the grounding plane of the wireless data terminal device with the grounding plane of the computer is practically narrow, which is difficult to satisfy the requirement on the energy return.

Figure 1:
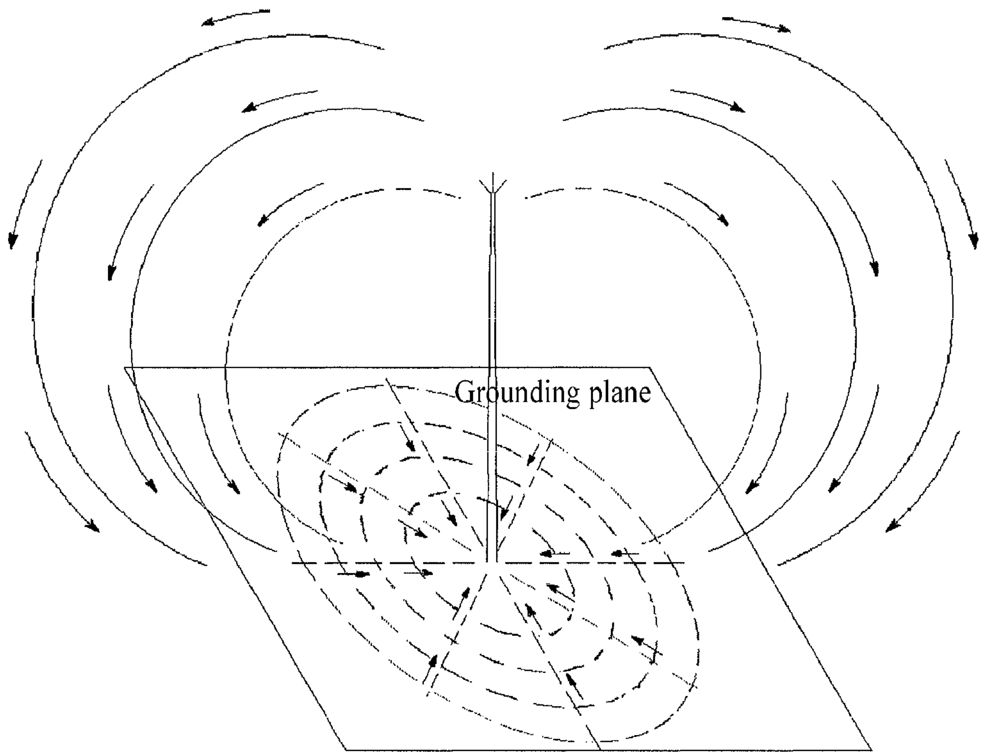
Fig. 1 (Prior Art)
FIG. 1 is a schematic diagram illustrating the operation of a conventional antenna.
Figure 2A:
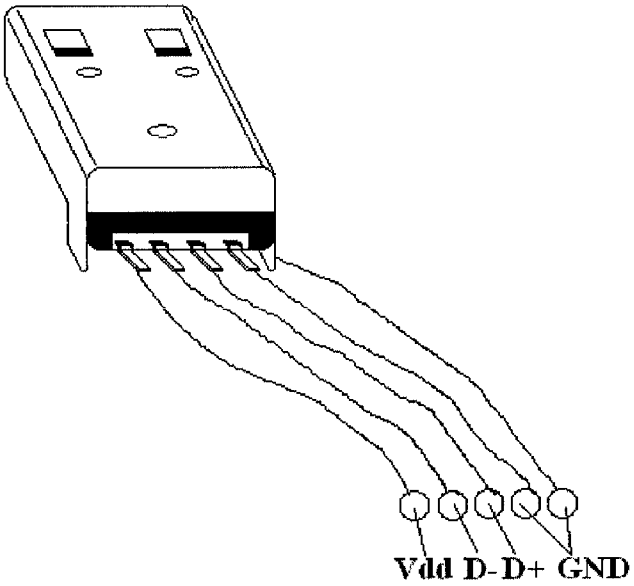
FIG. 2A is a schematic diagram illustrating a USB connector connection without an arrangement of double grounding according to an embodiment of the present disclosure.
Figure 2B:
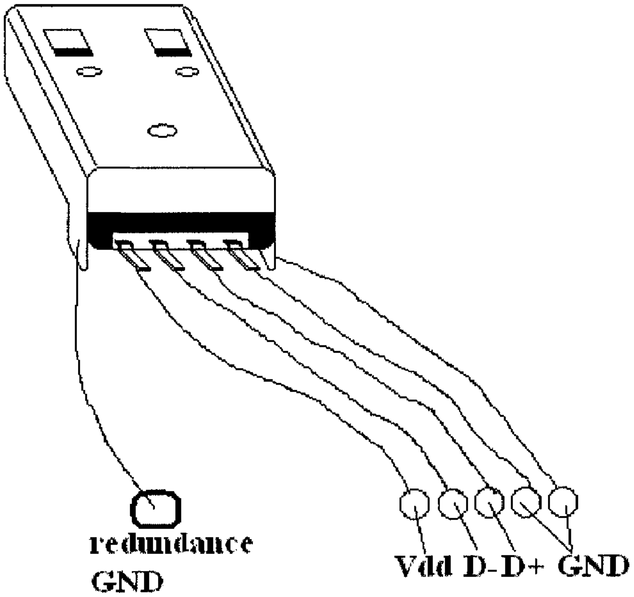
FIG. 2B is a schematic diagram illustrating the connection of the USB connector with a main circuit board via a newly added conducting wire according to an embodiment of the present disclosure.

FIG. 2A and FIG. 2B are schematic diagrams illustrating the ground wires of the USB connector portion of a wireless data terminal device with a rotary USB connector.

As shown in FIG. 2A, the USB connector portion of the existing wireless data terminal device with a rotary USB connector is not provided with double grounding. Due to the limitation of size and the structure of the rotary USB connector, the USB connector can be connected to the main circuit board only by several thin conducting wires or a narrow FPC flexible board, and the wiring is biased to one side of the USB connector. Although there are two grounding wires GND shown in FIG. 2A, the two grounding wires are equivalent to a single grounding circuit practically because the connection points on the main circuit board corresponding to the two grounding wires are adjacent to each other. Therefore, the connection of the grounding plane of the wireless data terminal device with that of the computer is narrow practically.

As shown in FIG. 2B, the USB connector portion of the wireless data terminal device with a rotary USB connector according to the embodiment adopts a double grounding arrangement, in which a grounding wire, redundance GND, is provided on a metal housing of the USB connector away from the original grounding point, and is connected to another grounding point on the main circuit board. In this way, both the USB connector and the main circuit board have two grounding points which are not adjacent to each other to form two grounding circuits and effectively enhance the connection of the grounding plane of the wireless data terminal device with that of the computer. Therefore, the wireless performance of the wireless data terminal device is improved substantially.

In accordance with an example, the Redundance GND grounding point as shown in FIG. 2B may be selected in accordance with one of the following principles or any combination thereof:

1. the grounding point on the connector side is separated by a certain distance from the original grounding point, preferably directly connected with the grounding plane of the computer, and is designed to be as close as possible to the grounding plane of the computer;
2. the grounding point on the main circuit board side is separated by a certain distance from the original grounding point; and
3. a relatively large and complete grounding plane is preferably selected as the connection point.

In the wireless data terminal device according to the embodiment, the USB connector is connected with the grounding plane of the main circuit board of the wireless data terminal device by using an additional conducting wire, in addition to the electric grounding wire of the USB of the wireless data terminal device. The grounding points on the USB connector side include a second grounding point disposed on the metal housing of the USB connector in addition to the signal pin of the USB connector. The second grounding point is directly connected with the grounding plane of the computer; moreover, the two grounding points are not adjacent to each other. Meanwhile, on the main circuit board of the wireless data terminal device, in addition to the signal GND of the USB bus, a relatively complete copper sheet subjected to bright copper process and directly connected to the PCB grounding plane is reserved on the PCB away from the signal GND connection point of the USB bus and close to the USB connector, serving as a second grounding point. Both of the second grounding points are connected by a metal dome to form the Redundance GND and guarantee the free movement of the USB connector.

Redundancy grounding of the USB connector of the wireless data terminal device is added according to the embodiment. Moreover, the separated arrangement enhances the connection of the grounding plane of the wireless data terminal device with that of the computer, and improves the reliability of the connection of the grounding plane of the USB connector wireless data terminal device and that of the computer. Therefore, the radio performance of the device is greatly improved, and the problem that the radio performance is degraded is solved. The reason for the degraded performance is that a big enough grounding plane cannot be formed because the connection of the grounding plane of the main circuit board of the wireless data terminal device with the grounding plane of the computer is narrow due to the limitation of space and connection mode. By comparison, the addition of Redundance GND ensures that the wireless radio frequency performance (TRP, TIS, etc.) of the terminal device with a detachable USB connector increases by about 5-10 dB in the low-frequency band such as 900 MHz and 850 MHz, and reaches substantially the same level as a terminal device with a fixed type USB connector.

A second embodiment of the present disclosure further provides a wireless data terminal device comprising a detachable USB connector. The embodiment is described in detail with reference to drawings.

Figure 3A:
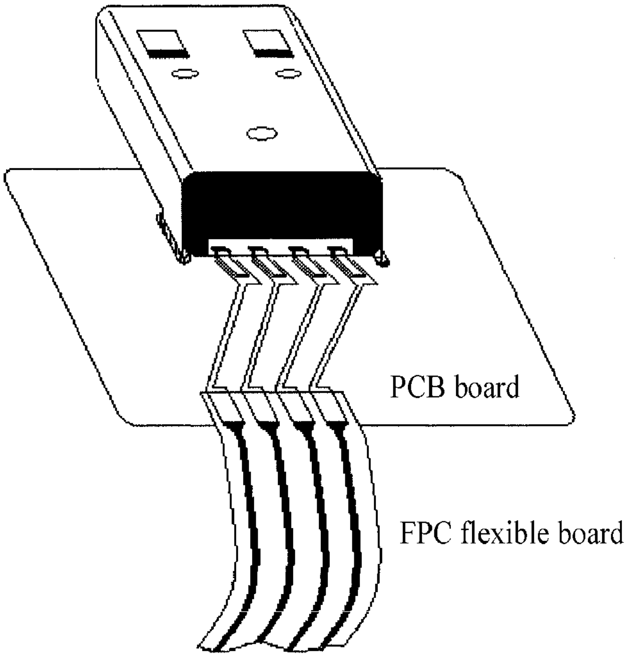
FIG. 3A is a schematic diagram illustrating a connection without double grounding by means of an FPC flexible board according to an embodiment of the present disclosure.
Figure 3B:
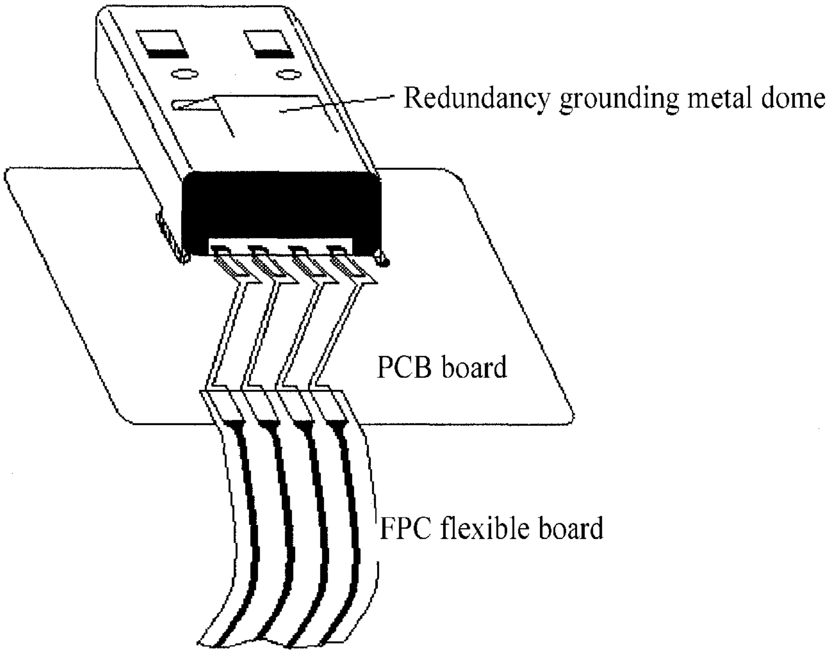
FIG. 3B is a schematic diagram illustrating a connection with double grounding by means of an FPC flexible board according to an embodiment of the present disclosure.

FIG. 3A and FIG. 3B are schematic diagrams illustrating the grounding wire of the USB connector portion of the wireless data terminal device with a sliding USB connector.

As shown in FIG. 3A, the USB connector portion of a prior art wireless data terminal device with a sliding USB connector is not provided with double grounding, in which the USB connector is fixed on the PCB, a USB signal and power supply are drawn out through the FPC flexible board, and the USB connector can protrude from the device with the sliding of the PCB board. It can be seen from FIG. 3A that the USB connector is connected with the grounding plane of the main circuit board only by a base line on the FPC flexible board. Although the requirement on current return can be satisfied, this point is a bottleneck for the connection of the grounding plane of the wireless data terminal device with that of the computer for radio frequency.

As shown in FIG. 3B, a double grounding arrangement is provided in the USB connector portion of the wireless data terminal device with a sliding USB connector according to the embodiment, in which a grounded USB metal dome extending from the main circuit board is jointed over the metal housing of the USB connector so that the operation of the USB connector cannot be influenced by stretching out drawing back of the USB connector in a sliding manner. A practical test shows that the radio performance of the device can be improved greatly after the ground return circuit of the metal dome is added.

In an example, the USB metal dome grounding point shown in FIG. 3B can be selected in accordance with one of the following principles or any combination:

1. the grounding point on the connector side is separated by a certain distance from the original grounding point, preferably directly connected with the grounding plane of the computer, and is designed to be as close as possible to the grounding plane of the computer;
2. the grounding point on the main circuit board side is separated by a certain distance from the original grounding point; and
3. a relatively large and complete grounding plane is preferably selected as the connection point.

In the wireless data terminal device according to the embodiment, in addition to an electric grounding wire of the USB of the wireless data terminal device, the metal housing of the USB connector on the USB connector side is taken as a second grounding point, which is not adjacent to a grounding signal of the USB bus in space and is connected with the grounding plane of the computer closely. A screening cover of the main circuit board on the main circuit board side is taken as a second grounding point, which is not only away from the original USB bus grounding point but also has a complete plane and is closely and reliably connected with the grounding plane of the main circuit board. Finally, the metal housing of the USB connector is connected with the second grounding point of the screening cover of the main circuit board of the wireless data terminal device by using an additional metal dome to form a Redundance GND.

Redundancy grounding of the USB connector of the wireless data terminal device is added according to the embodiment. Moreover, the separated arrangement enhances the connection of the grounding plane of the wireless data terminal device with that of the computer, and improves the reliability of the connection of the grounding plane of the USB connector wireless data terminal device and that of the computer. Therefore, the radio performance of the device is greatly improved, and the problem that the radio performance is degraded is solved. The reason for the degraded radio performance is that a big enough grounding plane cannot be formed because the connection of the grounding plane of the main circuit board of the wireless data terminal device with the grounding plane of the computer is narrow due to the limitation of space and connection mode. By comparison, the addition of Redundance GND ensures that the wireless radio frequency performance (TRP, TIS, etc.) of the terminal device with a detachable USB connector increases by about 5-10 dB in the low-frequency band such as 900 MHz and 850 MHz, and reaches substantially the same level as a terminal device with a fixed type USB connector.

The wireless data terminal device according to the embodiment not only improves the grounding effect of the wireless data terminal device with a detachable USB connector with the computer, but also improves the radio performance of the wireless data terminal device with a detachable USB connector, with easily and simply implemented technique and controllable cost.

The above specific embodiments further explain the objects, the technical solutions and the advantages of the present disclosure in detail. It should be understood that the above description is made only to illustrate the specific embodiments of the present disclosure and is not intended for limiting the scope of protection of the present disclosure. Any amendment, equivalent replacement, improvement and the like without departing from the spirit and principle of the present disclosure shall be included within the scope of protection of the present disclosure.

What is claimed is:

1. A wireless data terminal device, comprising a detachable Universal Serial Bus (USB) connector and a main circuit board, wherein a normal grounding connection and at least one redundance grounding connection are provided between the detachable USB connector and the main circuit board, and a redundance grounding point of the at least one redundance grounding connection on each of the detachable USB connector or the main circuit board is separated from a normal grounding point of the normal grounding connection on the respective one of the detachable USB connector or the main circuit board, so that the at least one redundance grounding connection is apart from the normal grounding connection.

2. The wireless data terminal device as claimed in claim 1, wherein the detachable USB connector is connected with the main circuit board through a conducting wire.

3. The wireless data terminal device as claimed in claim 2, wherein the at least one redundance grounding connection is a single conducting wire with one end being connected to a metal housing of the detachable USB connector and the other end being connected to the redundance grounding point of the main circuit board.

4. The wireless data terminal device as claimed in claim 2, wherein the detachable USB connector is a rotary USB connector.

5. The wireless data terminal device as claimed in claim 1, wherein the USB connector is connected with the main circuit board through a Flexible Printed Circuit (FPC) flexible board.

6. The wireless data terminal device as claimed in claim 5, wherein the at least one redundance grounding connections is a metal dome, which is connected to the upper part of a metal housing of the USB connector at a position different from a moving position of the USB connector, and is connected with the redundance grounding point of the main circuit board.

7. The wireless data terminal device as claimed in claim 5, wherein the detachable USB connector is a sliding USB connector.

8. A method for improving radio performance of a wireless data terminal device, comprising:

setting a normal grounding point and at least one redundance grounding points which is separated from the normal grounding point on a detachable Universal Serial Bus (USB) connector of the wireless data terminal device;

setting the normal grounding point and the at least one redundance grounding point which is separated from the normal grounding point on a main circuit board of the wireless data terminal device; and connecting the grounding points on the detachable USB connector with the respective grounding points on the main circuit board separately.

9. The method as claimed in claim 8, wherein the process of setting the normal grounding point and the at least one redundance grounding point which is separated from the normal grounding point on the detachable USB connector of the wireless data terminal device comprises:

in addition to a grounding point of a USB signal pin, providing a grounding point directly connected with the grounding plane of a computer and apart from the grounding point of the USB signal pin, on the metal housing of the detachable USB connector;

wherein the process of setting the normal grounding point and the at least one redundance grounding point which is separated from the normal grounding point on the main circuit board of the wireless data terminal device comprises:

in addition to a grounding point of the USB bus, providing a grounding point directly connected with the grounding plane of the main circuit board on the main circuit board, at a position relatively apart from the USB bus and relatively near to the detachable USB connector.

10. The method as claimed in claim 9, wherein the process of connecting the grounding points on the detachable USB connector with the respective grounding points on the main circuit board separately, comprises:

connecting the grounding point of the USB signal pin with the grounding point of the USB bus; and connecting the grounding point provided on the metal housing of the detachable USB connector with the grounding point provided on the main circuit board and directly connected with the grounding plane of the main circuit board.

11. The method as claimed in claim 8, wherein the process of setting the normal grounding point and the at least one redundance grounding point which is separated from the normal grounding point on the detachable USB connector of the wireless data terminal device comprises:

in addition to a grounding point of a USB electric grounding wire, configuring the metal housing of the detachable USB connector to be a grounding point which is directly connected with the grounding plane of a computer and is apart from the grounding point of the USB electric grounding wire;

and the process of setting the normal grounding point and the at least one redundance grounding point which is separated from the normal grounding point on the main circuit board of the wireless data terminal device comprises:

in addition to a grounding point of the USB bus, configuring a screening cover of the main circuit board to be a grounding point which is apart from the USB bus and is directly connected with the grounding plane of the main circuit board.

12. The method as claimed in claim 11, wherein the process of connecting the grounding points on the detachable USB connector with the respective grounding points on the main circuit board separately, comprises:

connecting the grounding point of the USB electric grounding wire with the grounding point of the USB bus; and connecting the metal housing of the detachable USB connector with the screening cover of the main circuit board.

13. A wireless data terminal device, comprising a detachable USB connector, being set with a normal grounding point and at least one redundance grounding point separated from the normal grounding point, a main circuit board, being set with the normal grounding point and the at least one redundance grounding point separated from the normal grounding point;

wherein the grounding points on the detachable USB connector connects with the respective grounding points on the main circuit board separately.

14. The wireless data terminal device as claimed in claim 13, wherein the grounding points on the detachable USB connector connect with the respective grounding points on the main circuit board by a grounding wire, which is provided on a metal housing of the USB connector away from the normal grounding point, and is connected to the redundance grounding point on the main circuit board.

15. The wireless data terminal device as claimed in claim 13, wherein the grounding points on the detachable USB connector connect with the respective grounding points on the main circuit board by a grounded USB metal dome, which extends from the main circuit board jointed over the metal housing of the USB connector, so that the operation of the USB connector is protected from stretching out drawing back of the USB connector in a sliding manner.

* * * * *

UNITED STATES PATENT AND TRADEMARK OFFICE

CERTIFICATE OF CORRECTION

PATENT NO. : 8,335,087 B2
APPLICATION NO. : 12/645192
DATED : December 18, 2012
INVENTOR(S) : Xie et al.

It is certified that error appears in the above-identified patent and that said Letters Patent is hereby corrected as shown below:

Title page, Item (75) city/country of residence for inventor Yanping Xie should read -- Shenzhen, CHINA --.

Title page, Item (75) city/country of residence for inventor Shuhui Sun should read -- Shenzhen, CHINA --.

Title page, Item (75) city/country of residence for inventor Qizhi Zhan should read -- Shenzhen, CHINA --.

Title page, Item (75) city/country of residence for inventor Shuqiang Gong should read -- Shenzhen, CHINA --.

Title page, Item (75) city/country of residence for inventor Chaoyan Zhang should read -- Shenzhen, CHINA --.

In the Claims:

Column 7, line 34, "connections" should read -- connection --.

Column 7, line 45, "points" should read -- point --.

Signed and Sealed this
Seventh Day of May, 2013

Teresa Stanek Rea
*Acting Director of the United States Patent and Trademark Office*